（12) United States Patent
Jacobsson et al.

(10) Patent No.: US 7,352,253 B2
(45) Date of Patent: Apr. 1, 2008

(54) OSCILLATOR CIRCUIT WITH TUNEABLE SIGNAL DELAY MEANS

(75) Inventors: Harald Jacobsson, Västra Frölunda (SE); Spartak Gevorgian, Göteborg (SE); Thomas Lewin, Onsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 38 days.

(21) Appl. No.: 10/581,788

(22) PCT Filed: Dec. 10, 2003

(86) PCT No.: PCT/SE03/01917

§ 371 (c)(1),
(2), (4) Date: Jun. 6, 2006

(87) PCT Pub. No.: WO2005/057777

PCT Pub. Date: Jun. 23, 2005

(65) Prior Publication Data

US 2007/0126511 A1 Jun. 7, 2007

(51) Int. Cl.
*H03B 27/00* (2006.01)
(52) U.S. Cl. .................. 331/57; 331/16; 331/74; 327/149; 327/150; 327/156; 327/161
(58) Field of Classification Search ............. 331/57, 331/16, 74; 327/149, 150, 153, 156, 158, 327/159, 161
See application file for complete search history.

(56) References Cited

U.S. PATENT DOCUMENTS

| 4,325,032 | A |  | 4/1982 | Gilden ................... 331/25 |
| 6,396,358 | B1 |  | 5/2002 | Poss et al. .............. 331/57 |
| 6,323,910 | B1 |  | 6/2004 | Clark, III ............... 348/537 |
| 7,145,373 | B2 | * | 12/2006 | Jaussi et al. ............ 327/158 |
| 2002/0008551 | A1 |  | 1/2002 | Sevalia et al. |

OTHER PUBLICATIONS

International Search Report for PCT/SE2003/001917 dated Jul. 12, 2004.

* cited by examiner

*Primary Examiner*—Arnold Kinkead
(74) *Attorney, Agent, or Firm*—Nixon & Vanderhye P.C.

(57) ABSTRACT

The invention discloses an oscillator circuit (100, 200, 300, 400), comprising an oscillating element (110, 210, 310, 410) and output means (115, 215, 315, 415) for outputting an oscillation frequency from the oscillating circuit. The circuit further comprises a signal delay means (120, 220, 320, 420) which is arranged in series with the oscillating element and feeds the output signal back to the oscillating element. The delay means is (120, 220, 320, 420) tuneable with respect to the delay it provides. The oscillating element can be an amplifier or a VCO, and the delay means can be a Delay Locked Loop or a tuneable delay line, depending on the embodiment of the invention.

11 Claims, 5 Drawing Sheets

OSCILLATOR CIRCUIT WITH TUNEABLE SIGNAL DELAY MEANS

This application is the US national phase of international application PCT/SE2003/001917 filed 10 Dec. 2003, which designated the U.S., the entire contents of which are hereby incorporated by reference.

TECHNICAL FIELD

The present invention relates to an oscillator circuit with delay means. The invention addresses, inter alia, problems with obtaining the correct delay in the delay means.

BACKGROUND ART

Time or phase delays in electrical signals are often used in various applications, such as, for example, electrically controlled antennas, phase shifters and frequency tuning of resonators in filters and oscillators.

For use in oscillator circuits, various principles using delay lines have been disclosed. A problem with delay lines in oscillators is that the delay provided by the delay lines must be very precise, due to the fact that the delay is optimal for a single frequency only, which thus makes the circuit sensitive, and necessitates a high degree of precision in the design and manufacture of the delay lines. In addition, the circuit becomes very sensitive to component variations in, for example, temperature and ageing.

Also, in circuits of the kind described, frequency tuning with maintained performance tend to be difficult, and the sensitivity for parameter variations tends to increase with increased performance of the oscillator circuit.

DISCLOSURE OF THE INVENTION

Thus, there is a need for an oscillator circuit which uses a delay component, but which does not have the drawbacks of earlier such circuits, as described above.

This need is addressed by the present invention in that it discloses an oscillator circuit comprising an oscillating element and output means for outputting an oscillation frequency from the oscillating circuit. The circuit further comprises signal delay means arranged in series with the oscillating element which feeds the output signal back to the oscillating element, and, according to the invention, the delay means is tuneable with respect to the delay it provides.

Due to the fact that the delay means is tuneable, various control means which will be described below in this text can be employed to overcome the drawbacks of previously known designs.

By means of the invention, the delay in the oscillator circuit can be controlled with a high degree of precision in an automated fashion in order to achieve the desired phase and thus the optimal performance of the circuit. The embodiments disclosed automatically adjust to the correct phase, and are thus less sensitive to component variations in, for example, processing, temperature or ageing. In addition, tuning of the oscillation frequency of the proposed embodiments of the invention with maintained performance will become simplified.

BRIEF DESCRIPTION OF THE DRAWINGS

The invention will be described in more detail in the following, with reference to the appended drawings, in which.

EMBODIMENTS

Figure 1:
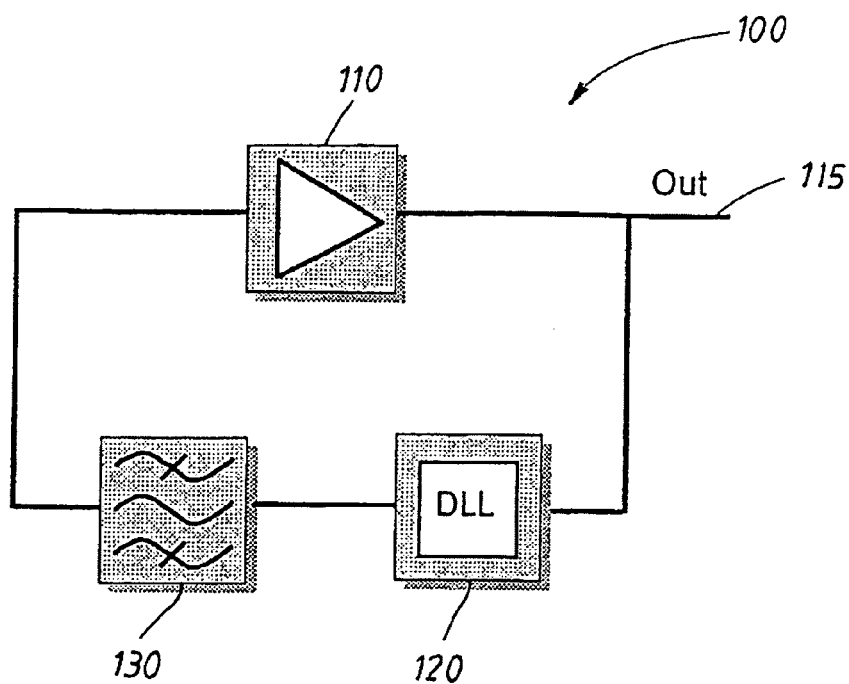
FIGS. 1 and 2 show embodiments of the invention using an amplifier.

FIG. 1 shows a first embodiment 100 of an oscillator circuit according to the invention. The circuit is a so called positive feedback amplifier oscillator.

As will become evident from FIG. 1, the circuit 100 comprises an amplifier 110, the output signal of which is used as the output signal 115 from the entire circuit 100. In addition, the circuit 100 comprises delay means 120 which is connected in series with the output signal 115 from the amplifier 110. The output signal from the delay means 120 is used as a feedback to the input of the amplifier 110, thus causing the amplifier to oscillate.

The delay means 120 in this embodiment of the invention is a so called Delay Locked Loop, commonly referred to as a DLL. The DLL as such is a known component, and will thus not be described in detail here. Various designs of DLL:s are known, and the exact kind of DLL which is employed in the circuit 100 is not of central importance to the invention. However, one known kind of DLL which might be used is that which employs inverters in so called delay cells.

The desired delay or phase shift in the DLL 120 is set initially, and the DLL 120 ensures that the phase shift which is obtained in circuit remains the same, irrespective of the oscillation frequency of the circuit 100, and also regardless of variations in design tolerances, temperature, ageing etc.

The output from the DLL 120 is thus fed back to the amplifier 110, causing the circuit 100 to oscillate, and the feed-back takes place via a pass-band filter 130, in order to remove other oscillation frequencies than the desired frequency of the oscillator circuit 100.

Thus, if the pass band of the filter 130 is tuneable, the frequency of the oscillator circuit 100 will be changeable, with the DLL 120 ensuring that the phase shift or delay which is obtained remains the same regardless of the operating frequency of the circuit 100. Such tuning means for the filter are not shown in FIG. 1, but can be employed to vary the oscillating frequency of the circuit 100. The tuning means are not shown in FIG. 1, since such means are well known to those skilled in the field.

Figure 6:
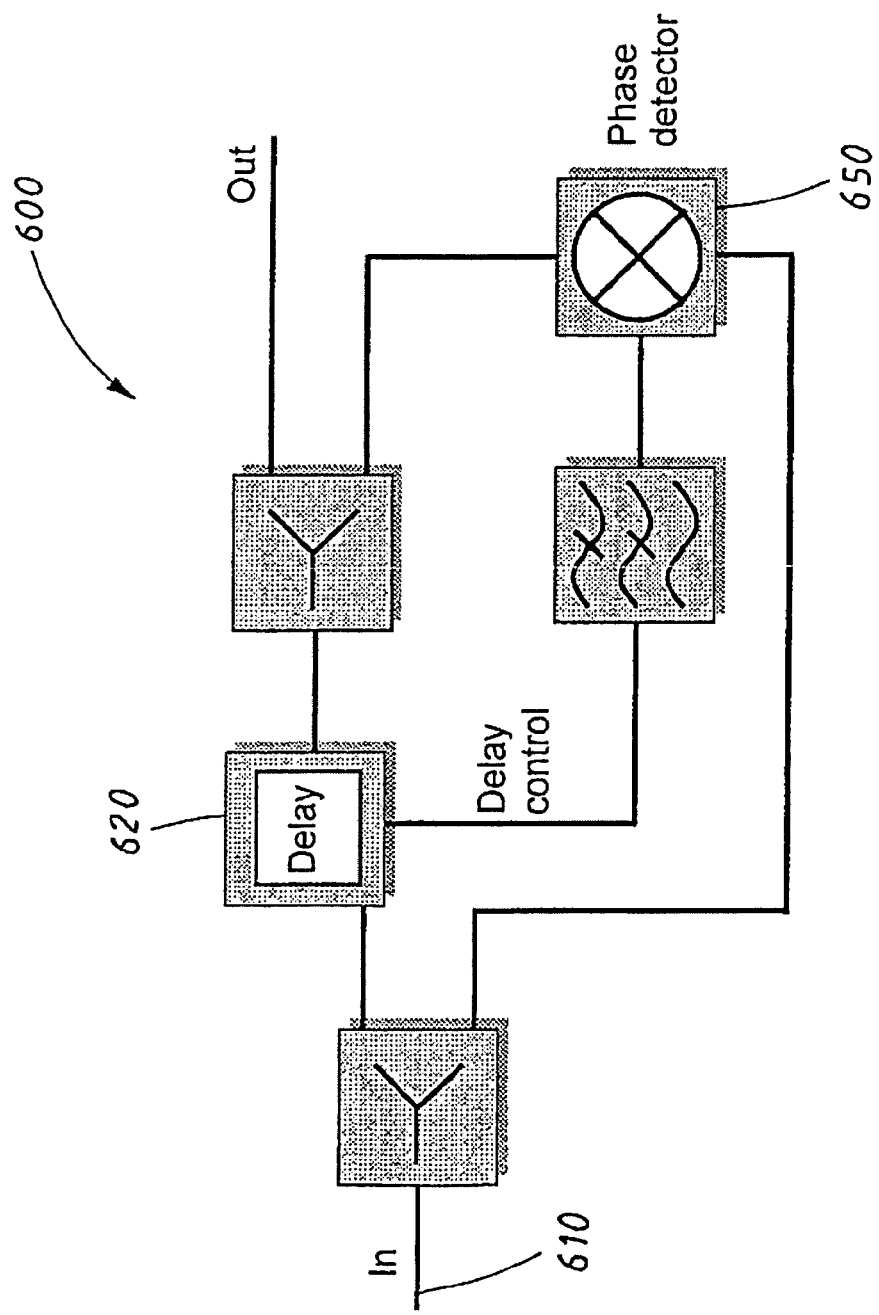
FIG. 6 shows the principle behind a known kind of circuit which is used in some embodiments of the invention, shown in order to facilitate the understanding of those embodiments.

However, for the sake of clarity, one example of a known type of DLL is shown in FIG. 6. That circuit will be explained at the end of this text, in order to facilitate the understanding of those embodiments of the invention which employ a DLL.

Turning now again to the DLL 120 in FIG. 1, it is preferable, but not necessary, to have a large time constant in the DLL-loop, so that the DLL doesn't regulate on fast phase variations due to, for example, noise.

Alternatively, there could be arranged a logic circuit which would only enable the DLL 120 to regulate for a limited time at, for example, start up of the oscillator circuit 100, or at regular intervals. The DLL could also be enabled for limited periods of time when the oscillating frequency of the circuit 100 is changed, which preferably done by altering the pass-band of the tuneable filter 130.

The longer the delay of the DLL is (expressed in the number of wavelengths), the lower the phase noise of the oscillator will be, but the narrower the pass-band of the filter has to be in order to avoid getting multiple frequencies where the oscillation condition for the circuit 100 is fulfilled:

$$\Delta\lambda/\lambda = \lambda/n+1$$

where $\Delta\lambda$ is the closest difference in wavelength between two frequencies fulfilling the oscillation condition of $l=n\lambda$ for a delay line of length l, and n is an integer, 1, 2, 3 . . . .

Usually, the delay that it is desired to obtain from the DLL 120 is 360°. However, a DLL will make it possible to obtain a large number of different phase delays, which can be accessed if this is desired. The use of a DLL as delaying element in the circuit 100 will ensure that the phase delay always remains constant, regardless of changes in the oscillating frequency of the circuit 100.

In addition, if the DLL uses a passive tuneable delay line such as, for example, a ferroelectric element, any desired phase delay can be obtained.

Figure 2:
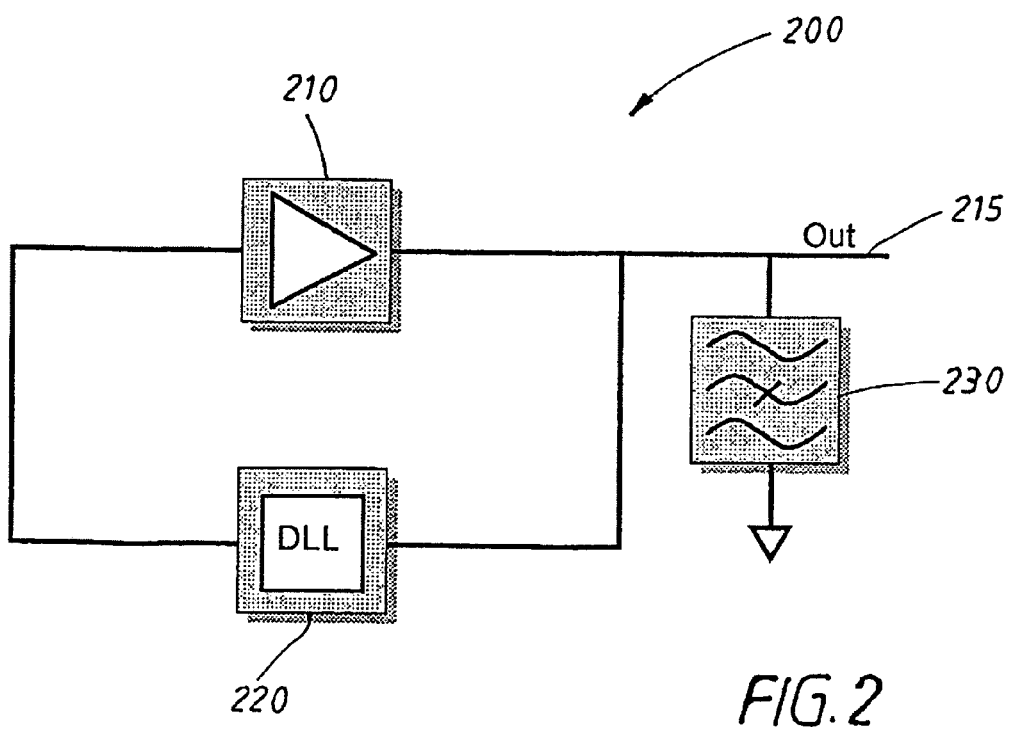

FIG. 2 shows an alternative embodiment 200 of an oscillator circuit based on the principle of a positive feed-back amplifier oscillator. Similarly to the oscillator circuit 100 of FIG. 1, the oscillator circuit 200 of FIG. 2 comprises an amplifier 210 and a DLL 220 which forms a feed-back loop with the amplifier, feeding back to the input of the operational amplifier the output signal 215 of the entire circuit 200. The circuit 200 also comprises a filter 230, but as opposed to the circuit 100, the circuit 200 makes use of a stop-band filter, which is placed in parallel to the feedback, i.e. not comprised in the feedback loop, but rather connecting the output 215 of the circuit 200 to ground, in order to "short out" frequencies outside of the stop band. Thus, only the desired frequencies are connected to the output 215 of the circuit 200.

An alternative principle for an oscillator circuit, in addition to the principle used in the embodiments shown in FIGS. 1 and 2, i.e. positive amplifier feed-back is the principle of self-injection locked oscillators using a delay line. An oscillating circuit 300 based on this alternative principle is shown in FIG. 3.

Figure 3:
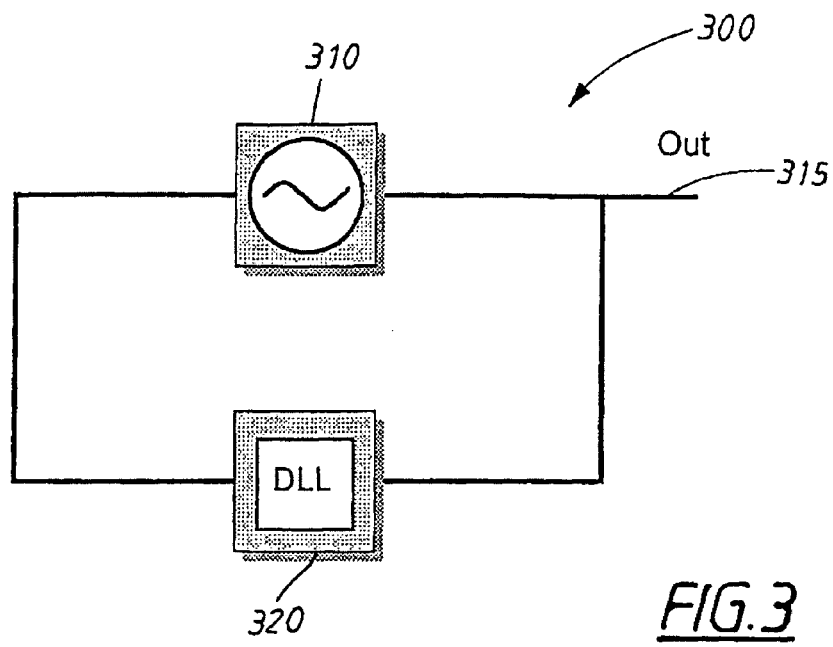
FIG. 3 shows an embodiment of the invention using a VCO.

As can be seen from FIG. 3, the oscillating element 310 of the embodiment 300 is not an amplifier, but rather an oscillator, for example a Voltage Controlled Oscillator, commonly abbreviated as VCO. In oscillator circuits based on the principle of self-injection locked oscillators, the phase noise of the oscillator circuit also becomes lower in proportion to the delay of the delay circuit employed, and it is of importance in this kind of oscillator circuits as well to control the phase of the feedback signal.

The output signal 315 from the oscillating element, the VCO 310 is used as output signal from the entire oscillating circuit 300 and, according to the invention, fed back to the VCO via a tuneable delay element, a DLL 320.

Since the function of the DLL has been touched upon earlier in this text, it will not be elaborated upon further here. However, the loop bandwidth of the DLL should be rather small, in order to ensure that the DLL doesn't regulate on phase noise, but only on changes in the oscillating frequency.

Figure 4:
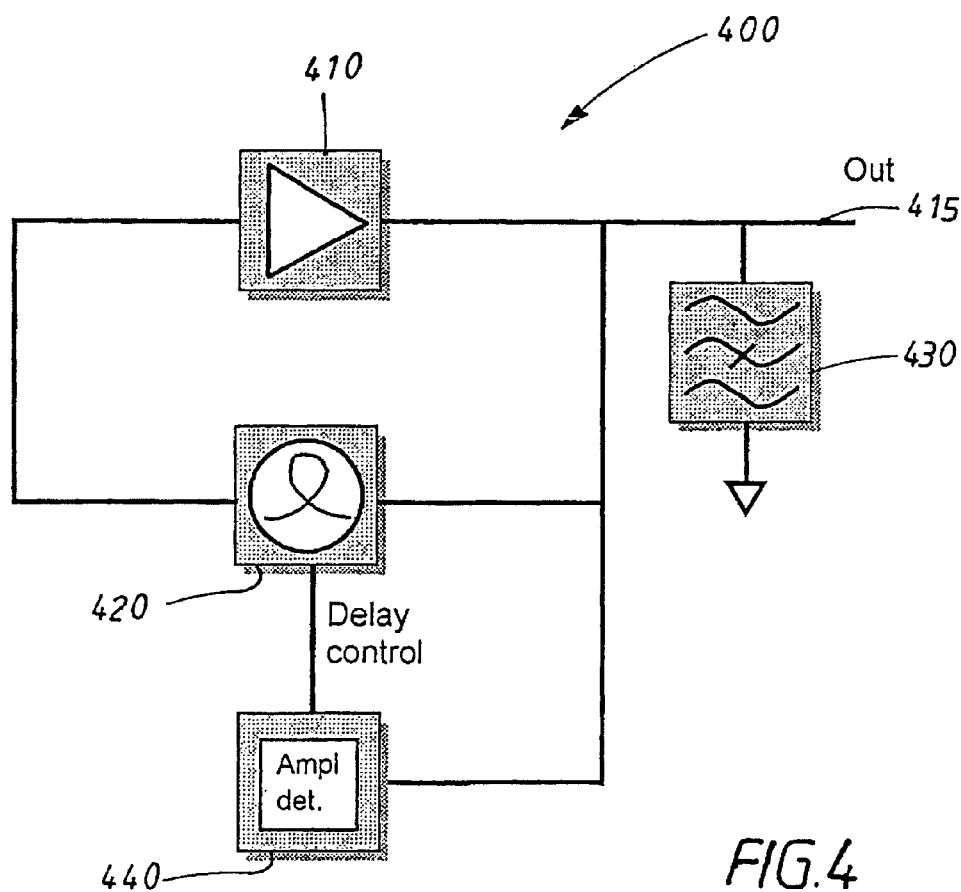
FIG. 4 shows an embodiment of the invention using an amplifier and a tuneable delay line.

In FIG. 4, another embodiment 400 of an oscillating circuit according to the invention is shown. This embodiment is similar to the embodiments 100 and 200 of FIGS. 1 and 2 in that the oscillating element of the circuit 400 is an amplifier 410. However, as opposed to those embodiments, the circuit 400 doesn't use a DLL as delaying element, but rather a so-called "free-running" tuneable delay line 420.

The output signal from the amplifier 410 is used as output signal from the entire circuit 400, and is also fed back to the input of the amplifier 410 via the delay line 420. However, since the delay line 420 is tuneable, the output signal of the amplifier 410 is also used as input signal to a control means 440 which controls the delay given by the delay line 440.

Before elaborating on the principle used for control of the delay line 440, a further component of the circuit 400 will now be described: In similarity to the embodiments of FIGS. 1 and 2, the circuit 400 comprises a filter, in this case a band-stop filter 430. The filter 430 is connected outside of the feedback loop, to ground, in parallel with the output signal 415 of the circuit 400, in order to short out undesired frequencies from reaching the output 415 of the circuit 400.

The idea behind the control principle used for the delay line 420 is that the amplitude of the oscillator circuit 400 will be at a maximum when the phase of the feedback signal is optimal for the frequency given by the filter 430, which preferably is a tuneable filter.

The control means 440 is thus preferably an amplitude detector, i.e. a component which senses the amplitude of the output signal 415 from the entire circuit 400. The amplitude detector 440 will by means of sensing the output signal 415 be able to continuously adjust the delay given by the delay line 420 so that the amplitude of the output signal 415 is maximised.

Adjustment of the oscillating frequency of the circuit 400 can be made possible by making the filter 430 tuneable.

The amplitude detector 440 is shown in FIG. 4 as sensing the output signal, by means of which it regulates the delay line 420. It can be mentioned here that the input signal to the amplitude detector could be the signal at virtually any other point in the circuit, so long as the same principle is adhered to, i.e. controlling the delay line 420 so as to maximise the signals detected by the detector 440.

It should be mentioned that a circuit similar to the one in FIG. 4 can be made by employing a band-pass filter in series with the delay line, instead of the band-stop filter of the circuit in FIG. 4. Suitably, the pass band of such a filter should then correspond to the stop band of the filter 430.

As for the tuneable delay line 420, examples of such components are ferroelectric delay lines, SAW- or MSW-circuits, or active delay circuits. (MSW, Magnetostatic Wave).

Figure 5:
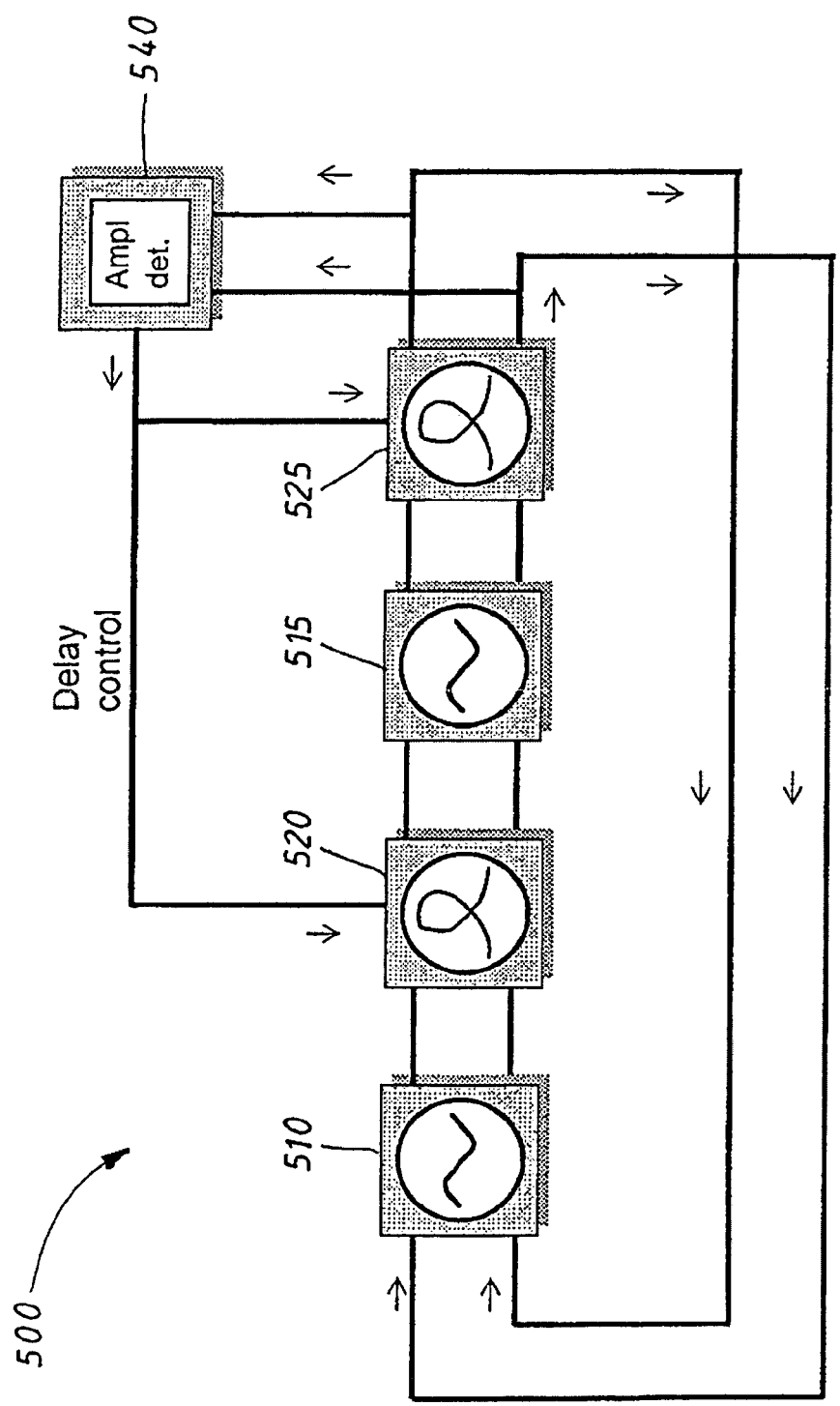
FIG. 5 shows another embodiment of the invention.

FIG. 5 shows yet another embodiment 500 of the present invention. It is previously known to connect two identical so called differential VCO:s in a so called ring structure (as shown in FIG. 5) in order to force them to operate in quadrature, i.e. with a phase difference of 90° between them.

A drawback of this known arrangement is that the VCO:s won't operate optimally for low phase noise. Typically, for frequencies below 10 GHz, the delay in each of the VCO:s will be too small to obtain the desired 90° phase shift. This causes the natural phase of the VCO to be disturbed by the injection locking signal, which in turn causes the phase noise to increase.

The circuit 500 is a variation of this known design, with modifications according to the present invention: two VCO:s 510, 515 are connected in the mentioned and previously known ring arrangement. Thus, the two VCO:s 510, 515, are connected in series via two branches, an "upper" and a "lower" branch. The output of the "lower" branch is used as input to the "upper" branch, and the output of the "upper" branch is used as input to the "lower" branch.

However, as opposed to previously known ring arrangements, there is a first 520 delay component arranged between the first 510 and the second 520 VCO, and in series with the second VCO 515 there is arranged a second delay component 525. The phase shift of ninety degrees between each oscillator is used so that the outputs from the first oscillator are 0 degrees and 180 degrees respectively, and the outputs from the second oscillator are 90 and 270 degrees.

By introducing delay components 520, 525, which have a built-in delay which equals ninety degrees minus that of the oscillators, the oscillators 510, 525, will operate in an optimal fashion. In order to overcome variations due to, for example, temperature, ageing and component variations, tuneable delay components are preferably chosen as the delay components 520 and 525.

Preferably, but not necessarily, the tuneable delay components are tuneable "free-running" delay lines of the kind also employed in the embodiment of the invention shown in FIG. 4. The delay given by the delay components 520, 525, can then be controlled automatically by an oscillator amplitude control circuit 540, which is arranged in the circuit 500 to detect the signal amplitude in both the "upper" and the "lower" branch of the circuit, and to output appropriate control signals to both of the delay components.

As with the circuit 400 of FIG. 4, the idea of the amplitude detector 540 in the circuit 500 is that the oscillator 500 operates optimally, i.e. with the correct delay, when the oscillator amplitude is at a maximum in both branches, which is ensured by the amplitude detector 540.

As an alternative to the "ring structure" shown in FIG. 5, a similar circuit could be obtained by connecting a desired number, e.g. four, VCO:s in series, with a delay component similar to the ones shown in FIG. 5 connected in series with the VCO:s, in such a manner that each VCO is connected to a delay component, with the delay components placed alternatingly between VCO.

In order to facilitate the understanding of some of the embodiments of the present invention, a known kind of delay-locked loop (DLL) circuit 600 is shown in FIG. 6. The circuit 600 in FIG. 6 comprises first input means 610 for an input signal, $V_{in}$, which input means split the input signal into a first and a second input branch.

The signal in the first input branch of the DLL-circuit is input to a tuneable delay component 620, which component thus also has an input possibility for the input of a control or tuning signal, said control signal controlling the delay of the input signal $V_{in}$.

The output from the delay component 620 is split into a first and a second output branch, where the first output branch is used as an output signal from the DLL-circuit, the signal having the desired delay.

The signal in the second output branch from the delay component 620 is used as one of two input signals to a phase detector 650.

The signal in the second input branch of the DLL is used as the other of the two input signals to the phase detector 650. Thus, the phase detector serves to detect the phase difference or delay between the non-delayed signal and the output signal from the delay component. The output signal from the phase detector corresponds to the phase difference, and is used as the control signal for the delay component 620 in the first input branch of the DLL-circuit. Suitably, the output signal from the phase detector is passed through a low-pass filter 640 before being input to the delay component 620.

The DLL of FIG. 6 can thus provide a phase delay of an input signal, with the phase delay being varied by means of a control signal. A common kind of DLL employs inverters in so called delay cells as the delay element in the DLL, but naturally DLL:s of other kinds can be envisioned, for example DLL:s with continuously variable delay.

Reverting now to the circuit shown in FIG. 5, it should be pointed out that the number of oscillators and delay components can be varied, so long as each oscillator is "paired" with one delay component. Various phase shift can then be obtained from each oscillator, in steps of 360/N, where N is the number of oscillators.

It should be realized that a number of variations on the embodiments of the invention can be carried out within the scope of the invention. For example, it should be realized that in those circuits above which have utilized an amplifier as the oscillating element, the oscillating element can instead be a VCO, in which case the filter used in the circuit can be omitted, and conversely, an amplifier can replace the VCO where shown, if a proper filter is inserted into the circuit.

Also, band pass filters inside the feedback loop can be replaced with band stop filters outside of the feedback loop, connected to ground.

Figure 7:
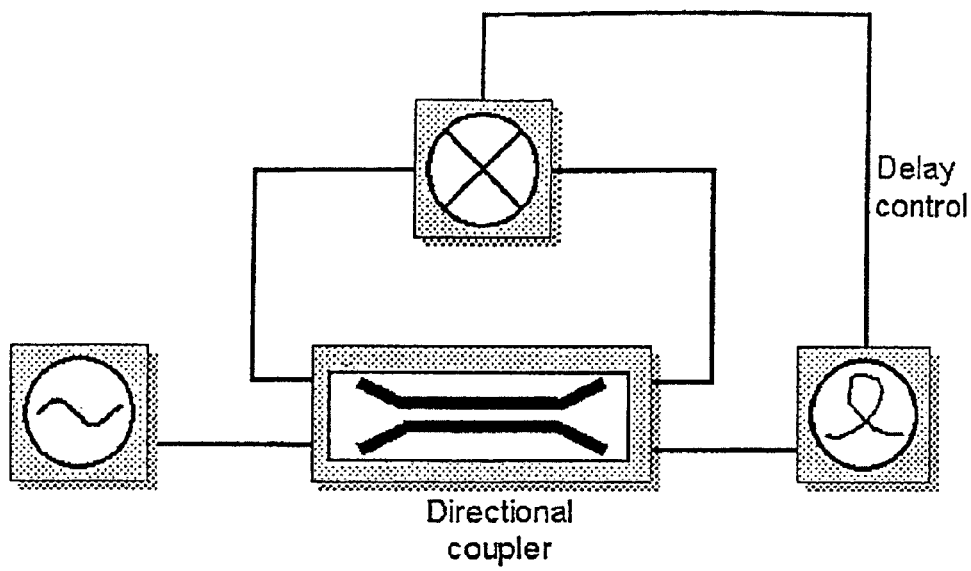
FIG. 7-8 show alternative embodiments of the invention.
Figure 8:
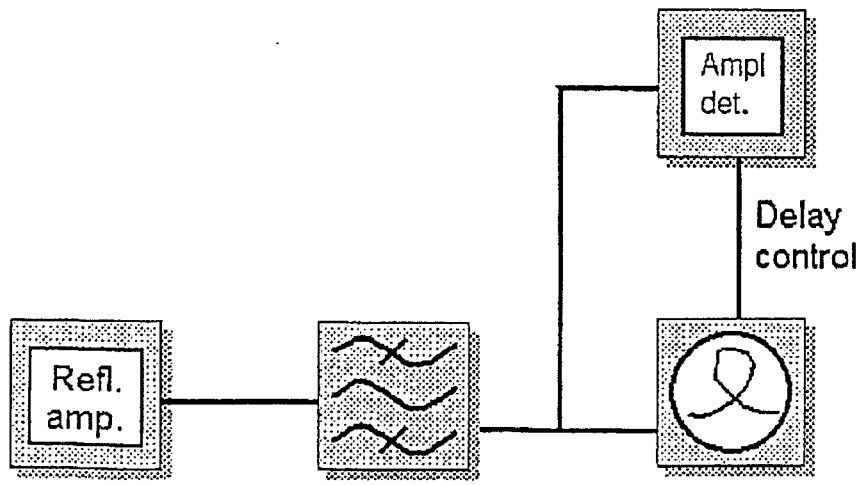

In FIGS. 7 and 8, two alternative embodiments of the circuits depicted in FIG. 3 and 4 respectively are shown. Both of these embodiments are based on a reflection-type of delay line connected in series to a VCO (FIG. 7) or an amplifier (FIG. 8).

The delay line is terminated in either a short circuit or an open end causing a (complete) reflection of the signal. In this way, the delay line can be made only half the length for a certain desired delay.

There are some further differences when a reflection-type of delay line is used. First, if a DLL is to be used, one must be able to distinguish the phase of the incoming signal from the phase of the reflected signal. This can be accomplished by the use of a directional coupler. The directional coupler can be made such that only a small fraction fo the signal is coupled out for phase comparison. Second, if an amplifier is used (FIG. 8) the amplifier must be of the reflection type, i.e. an amplifier whose reflection coefficient is greater than 1. If an injection locked oscillator is used (FIG. 8), the oscillator must be able to deliver the output signal at the same port as the injection signal is injected.

In both cases the amplifier and the oscillator can be interchanged, with filters added where appropriate.

In all the applications described, a ferroelectric delay line may with advantage be used.

The invention claimed is:

1. An oscillator circuit, comprising an oscillating element and output means for outputting an oscillation frequency from said oscillating circuit, the circuit further comprising a signal delay means which is arranged in series with the oscillating element and feeds the output signal back to the oscillating element, the delay means being tuneable with respect to the delay it provides, characterized in that the signal delay means is a tuneable delay line comprising a control input, to which is connected the output signal from an amplitude detector, with the amplitude detector sampling the signal at a chosen point in the circuit and controlling the delay means so that a maximum output signal is obtained from the oscillator circuit.

2. The oscillator circuit of claim 1, in which the oscillating element is an amplifier.

3. The oscillator circuit of claim 2, further comprising a filter.

4. The oscillator circuit of claim 3, in which the delay means is a Delay Locked Loop.

5. The oscillator circuit of claim 4, in which the filter is a pass-band filter connected in series with the delay element, so as to filter the signal before it is fed back to the oscillating element, but after it has passed through the delay element.

6. The oscillator circuit of claim 4, in which the filter is a stop-band filter connected between the output means and ground, so as to enable only the desired frequency to pass.

7. The oscillator circuit of claim 4, in which the filter is a stop-band filter connected between the output means and ground, so as to enable only the desired frequency to pass.

8. The oscillator circuit of claim 1, in which the oscillating element is a voltage controlled oscillator.

9. The oscillator circuit of claim 1, in which the delay means is a Delay Locked Loop.

10. The oscillator circuit of claim 1, in which the delay means is a tuneable delay line.

11. The oscillator circuit of claim 8, comprising at least a first and a second VCO and first and second tuneable delay lines, in which the VCO:s, are connected in series via two branches, an "upper" and a "lower" branch, the output of the "lower" branch being used as input to the "upper" branch, and the output of the "upper" branch being used as input to the "lower" branch, with the delay means being connected one between each of the VCO:s, in series with them, so that the upper branch output of the first and second VCO are separated by the same phase distance as their respective lower branch outputs, suitably ninety degrees.

* * * * *